US008856704B2

(12) United States Patent
Baeg

(10) Patent No.: US 8,856,704 B2
(45) Date of Patent: Oct. 7, 2014

(54) LAYOUT LIBRARY OF FLIP-FLOP CIRCUIT

(75) Inventor: Sang Hyeon Baeg, Seoul (KR)

(73) Assignee: Industry-University Cooperation Foundation Hanyang University (KR)

( * ) Notice: Subject to any disclaimer, the term of this patent is extended or adjusted under 35 U.S.C. 154(b) by 0 days.

(21) Appl. No.: 13/989,052

(22) PCT Filed: Nov. 21, 2011

(86) PCT No.: PCT/KR2011/008888
§ 371 (c)(1),
(2), (4) Date: May 22, 2013

(87) PCT Pub. No.: WO2012/070821
PCT Pub. Date: May 31, 2012

(65) Prior Publication Data
US 2013/0268904 A1 Oct. 10, 2013

Related U.S. Application Data

(60) Provisional application No. 61/416,253, filed on Nov. 22, 2010.

(51) Int. Cl.
G06F 17/50 (2006.01)
H01L 27/02 (2006.01)
H03K 3/356 (2006.01)

(52) U.S. Cl.
CPC .......... *G06F 17/505* (2013.01); *G06F 17/5068* (2013.01); *H01L 27/0207* (2013.01); *H03K 3/356156* (2013.01)
USPC ............................ 716/110; 716/119; 716/132

(58) Field of Classification Search
None
See application file for complete search history.

(56) References Cited

U.S. PATENT DOCUMENTS

| 4,849,904 | A | * | 7/1989 | Aipperspach et al. | ........ 716/139 |
| 5,157,618 | A | * | 10/1992 | Ravindra et al. | ................ 716/50 |
| 5,901,066 | A | * | 5/1999 | Hong | ................ 716/52 |
| 5,923,569 | A | * | 7/1999 | Kumashiro et al. | ........... 716/105 |
| 6,571,374 | B1 | * | 5/2003 | Runyon et al. | ................ 716/112 |
| 6,710,371 | B2 | * | 3/2004 | Kitahara et al. | ................ 257/69 |
| 7,272,812 | B2 | * | 9/2007 | Ishiyama | ................ 716/102 |
| 7,895,560 | B2 | * | 2/2011 | Lovell | ................ 716/119 |
| 8,111,089 | B2 | * | 2/2012 | Cocchi et al. | ................ 326/121 |
| 8,434,046 | B2 | * | 4/2013 | Marinet | ................ 716/119 |
| 2002/0040985 | A1 | | 4/2002 | Aldrich | |
| 2010/0281446 | A1 | * | 11/2010 | Hou et al. | ................ 716/6 |
| 2012/0023473 | A1 | * | 1/2012 | Brown et al. | ................ 716/133 |
| 2012/0131533 | A1 | * | 5/2012 | Marinet | ................ 716/122 |

FOREIGN PATENT DOCUMENTS

| JP | 2005236210 A | 9/2005 |
| JP | 2009267094 A | 11/2009 |

* cited by examiner

*Primary Examiner* — Leigh Garbowski

(57) ABSTRACT

Provided is a layout library having a plurality of unit layouts in which the same flip-flop circuit is implemented. In the layout library, at least two unit layouts have mutually different arrangement structures. Therefore, coupling capacitances seen at an equal node with respect to the two flip-flop circuits appear to be different from each other. A semiconductor designer can select a layout in which a desired coupling capacitance is set through wiring, and through this, can adopt a required flip-flop circuit.

13 Claims, 13 Drawing Sheets

FIG.1

| FF1 | FF2 |
|-----|-----|
| FF3 | FF4 |

PRIOR ART

LAYOUT LIBRARY OF FLIP-FLOP CIRCUIT

TECHNICAL FIELD

The present invention relates to a method of designing a semiconductor circuit, and more particularly, to a method of using and arranging a plurality of flip-flops and a semiconductor circuit manufactured using the method.

BACKGROUND ART

Flip-flops that are data storage circuits can be used in various application fields. In a semiconductor circuit, a flip-flop stores or outputs at least 1-bit data, in synchronization with a clock signal.

Thus, flip-flops are circuits that have been widely used in semiconductor circuits, in the field of memory/non-memory. Recently, flip-flop circuits of a specific model have been laid out on a substrate and the layout of the flip-flop circuits has been unilaterally applied as a library to a semiconductor circuit.

In particular, since a plurality of flip-flops are used in a semiconductor circuit, a set of at least one flip-flop is applied as a layout on a substrate.

Figure 1:
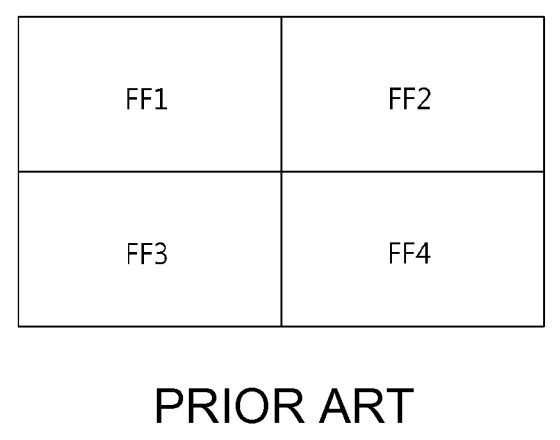

FIG. 1 is a block diagram of a library of conventional flip-flops provided using a general semiconductor design tool.

Referring to FIG. 1, four flip-flops FF1, FF2, FF3, and FF4 that perform specific functions form the same equivalent circuits, and layouts of the respective flip-flops are the same according to the same equivalent circuits.

A layout is a plan view of an aspect of a semiconductor circuit that is actually formed on a substrate. During an actual semiconductor design process, performing of a layout is indispensable to designing a transistor-level circuit and entering a manufacturing process. An exposure process is performed and an etch mask is manufactured, based on the layout. Thus, a transistor and a wiring pattern are formed on locations that are substantially identical to the layout, and are also shaped to be substantially identical to the layout.

FIG. 1 discloses the technique described above, in which a layout of a set of flip-flop circuits is the same as that of the other flip-flop circuits. Thus, in a semiconductor circuit, all of the layouts of the flip-flops FF1, FF2, FF3, and FF4 are the same. The layouts of the respective flip-flops are disposed adjacent to one another to form a set to flip-flops, and input/output lines thereof are connected during a subsequent wiring process.

When this structure is employed, a coupling capacitance occurs between adjacent flip-flops. The coupling capacitance causes cross-talk to occur in flip-flops that form a signal channel, thereby deteriorating a signal to be transmitted. Also, when a capacitor should be employed in flip-flops to adjust a signal transmission speed or a response rate, it is difficult to form a physical capacitor in the flip-flops that form a signal transmission path. This is because one flip-flop library is used and additional flip-flops thus cannot actually be laid out. In particular, when a plurality of flip-flops having the same shape are laid out and employed in a circuit, a soft error or the like inevitably occurs due to the cross-talk.

Also, a library provides a plurality of flip-flops of the same layout. Thus, when in various circuit constructions, impedance matching is needed due to different gates or circuits connected to an output terminal or an input terminal, additional matching means should be interposed between the flip-flops and a peripheral circuit. In general, as the matching means, a physical capacitance is artificially set or a capacitance is set using an additional transistor. In this case, diversity cannot be secured in selecting circuits during a semiconductor design process, and a burden on a manufacturing process is increased since an additional circuit is added.

DETAILED DESCRIPTION OF THE INVENTION

Technical Problem

It is an objective of the present invention to provide a layout library of flip-flops that have the same shape in view of a circuit diagram but have different shapes in view of a layout.

Technical Solution

To accomplish the objective, the present invention provides a layout library in which a plurality of flip-flops have the same equivalent circuits and a plurality of unit layouts are combined, wherein a first unit layout has a different arrangement from a second unit layout adjacent to the first unit layout.

To accomplish the objective, the present invention also provides a layout library in which flip-flops are embodied as semiconductor circuits, the layout library including a first unit layout in which two latches are arranged, and a second unit layout which is included in a region adjacent to the first unit layout, in which two latches are arranged, and which has a different arrangement from the first unit layout.

To accomplish the objective, the present invention also provides a layout library in which flip-flops are embodied as semiconductor circuits, the layout library including a first flip-flop including at least two latches, and a second flip-flop including at least one latch that shares the same unit layout with at least one of the at least two latches of the first flip-flop.

Advantageous Effects

According to the present invention as described above, flip-flops have the same equivalent circuits. That is, the flip-flops have the same circuit diagram and functions but have different shapes in view of a layout. Thus, a coupling capacitance occurring between adjacent flip-flops may be used if needed. Also, a flip-flop matching the impedances and frequency characteristics of peripheral circuits connected to an input terminal and an output terminal of a flip-flop circuit may be selected.

In other words, a semiconductor designer may select a layout according to a purpose of a circuit to be finally formed, form flip-flops classified into groups based on the layout, and perform a wiring process to match functions of the circuit to be finally formed.

BRIEF DESCRIPTION OF THE DRAWINGS

FIG. 1 is a block diagram of a library of conventional flip-flops provided using a general semiconductor design tool.

BEST MODE FOR CARRYING OUT THE INVENTION

Figure 2:
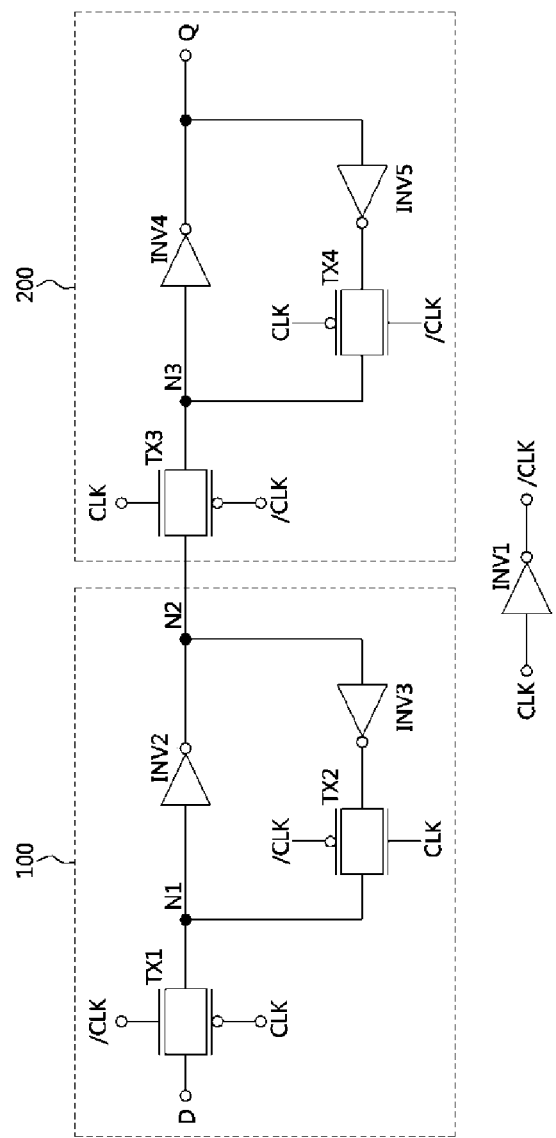
FIG. 2 is a circuit diagram of one of flip-flops classified into groups according to an exemplary embodiment of the present invention.

The present invention may be embodied in different forms and exemplary embodiments of the present invention will thus be illustrated in the drawings and described in the present disclosure in detail. However, the present invention is not limited to the particular embodiments and should be construed as covering all modifications, equivalents, and substitutes thereof. The same reference numerals represent the same elements throughout the drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in greater detail with reference to the accompanying drawings.

Embodiments

FIG. 2 is a circuit diagram of one of flip-flops classified into groups according to an exemplary embodiment of the present invention.

Referring to FIG. 2, the flip-flop is embodied as a D flip-flop. However, the D flip-flop is just an example, and the flip-flop may be embodied as any of various other types of flip-flops.

Referring to FIG. 2, the D flip-flop includes a master latch 100 and a slave latch 200. The master latch 100 samples and stores input data D at a rising edge of a clock signal CLK. The slave latch 200 transmits the sampled input data D as output data Q in a section in which the clock signal CLK is high level, and stores and retains the output data Q in a section in which the clock signal CLK is low level.

The master latch 100 includes two transmission gates and two inverters, and the slave latch 200 includes two transmission gates and two inverters. Each of the transmission gates forms a switch, and each of the inverters is embodied as an inverter connected to an NMOS transistor and a PMOS transistor. Thus, the master latch 100 or the slave latch 200 includes at least two switches and two inverters.

Each of the transmission gates and the inverters preferably has a complementary metal-oxide semiconductor (CMOS) structure.

The master latch 100 includes a first switch TX1, a second inverter INV2, a third inverter INV3, and a second switch TX2.

The slave latch 200 includes a third switch TX3, a fourth inverter INV4, a fifth inverter INV5, and a fourth switch TX4.

The master latch 100 and the slave latch 200 have the same circuit structure but may be configured to be different according to a designer's intention.

First, a first inverter INV1 generates an inverted clock signal /CLK by inverting the clock signal CLK. The clock signal CLK and the inverted clock signal /CKL are used to control operations of switches so as to perform sampling and holding on the input data D.

The first switch TX1 is connected between an input data D terminal and a first node N1. The first switch TX1 is turned on to supply the input data D to an input terminal of the second inverter INV2, when the clock signal CLK is low level.

The second inverter INV2 is connected between the first node N1 and a second node N2. The second inverter INV2 inverts the input data D and outputs the inverted input data D to the second node N2, when the first switch TX1 is turned on.

The third inverter INV3 and the second switch TX2 are connected in series between the second node N2 and the first node N1. That is, the third inverter INV3 and the second switch TX2 form a feedback path together. In particular, the second switch TX2 is embodied as a latch configured to be turned on and store the input data D when the clock signal CLK is high level. A latch configured to store the input data D is formed by connecting the second inverter INV2 and the third inverter INV3.

The third switch TX3 is connected between the second node N2 and a third node N3. When the clock signal CLK is high level, the third switch TX3 is turned on to supply data, which is transmitted to the second node N2 from the second inverter INV2 and the third inverter INV3 that are configured to perform latching, to the third node N3.

The fourth inverter INV4 is connected between the third node N3 and an output data Q terminal. The fourth inverter INV4 inverts a signal of the third node N3 to form the output data Q.

Also, the fifth inverter INV5 and the fourth switch TX4 are connected in series between the output data Q terminal and the third node N3. In particular, the fourth switch TX4 is turned on when the clock signal CLK is low level, and the fourth inverter INV4 and the fifth inverter INV5 form latches. Thus, when the clock signal CLK is low level, transmission of a signal from the second node N2 is blocked, and signals latched by the fourth inverter INV4 and the fifth inverter INV5 are transmitted to the output data Q terminal.

The flip-flop of FIG. 2 shows an aspect of an operation of a typical D flip-flop. In other words, the input data D is sampled, latched, and transmitted to the output data Q terminal, at a rising edge of the clock signal CLK.

Figure 3:
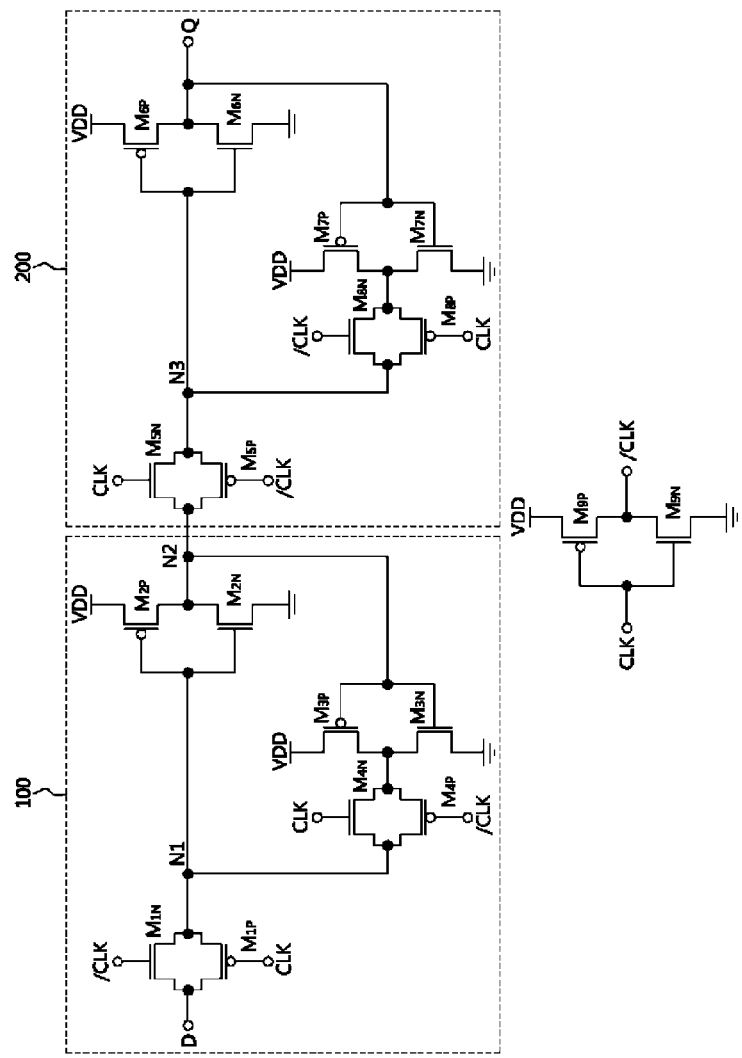
FIG. 3 is a circuit diagram illustrating a result of configuring a circuit in FIG. 2 at a transistor level according to an exemplary embodiment of the present invention.

FIG. 3 is a circuit diagram illustrating a result of configuring the circuit in FIG. 2 at a transistor level according to an exemplary embodiment of the present invention.

Referring to FIG. 3, a master latch 100 is disposed between an input data D terminal and a second node N2, and a slave latch 200 is disposed between the second node N2 and an output data Q terminal.

The master latch 100 is embodied as a combination of four NMOS transistors and four PMOS transistors.

First, a first inverter configured to invert a clock signal CLK includes transistors M9n and M9p. One end of the transistor M9p is connected to a positive power supply voltage VDD source, and one end of the transistor M9n is connected to a negative power supply voltage VSS source or a ground voltage source. In a general CMOS circuit, a negative power supply voltage VSS may be interchangeably used with a ground voltage. Thus, in circuit diagrams of the present invention, a ground voltage may be understood as an actual ground level or the negative power supply voltage VSS having a specific level.

The first switch is also embodied as a transmission gate in which two transistors are connected in parallel. That is, the first switch may be formed by connecting transistors M1n and M1p in parallel. Also, an inverted clock signal /CLK is input to a gate terminal of the transistor M1n, and the clock signal CLK is input to a gate terminal of the transistor M1p. Accordingly, the first switch is turned on when the clock signal CLK is low level.

A second inverter includes transistors M2p and M2n. Gate terminals of both the transistors M2p and M2n are commonly connected to a first node N1. In the second inverter, the transistor M2p is connected to a positive power supply voltage VDD source and the transistor M2n is connected to a ground voltage source. An output of the second inverter is supplied to the second node N2.

A third inverter includes two transistors M3p and M3n disposed between the positive power supply voltage VDD source and the ground voltage source. An output of the third inverter is supplied to a second switch.

The second switch is embodied as a transmission gate, and has a structure in which transistors M4n and M4p are connected in parallel. Also, the clock signal CLK is supplied to a gate terminal of the transistor M4n, and the inverted clock signal /CLK is supplied to a gate terminal of the transistor M4p. Thus, the second switch is turned on when the clock signal CLK is high level. A signal passing through the second switch is input to the first node N1.

The slave latch 200 is disposed between the second node N2 and an output data Q terminal, and includes four NMOS transistors and four PMOS transistors.

First, a third switch is connected between the second node N2 and a third node N3, and includes two transistors M5n and M5p. The clock signal CLK is input to a gate terminal of the transistor M5n, and the inverted clock signal /CLK is input to a gate terminal of the transistor M5p. Thus, the third switch is turned on when the clock signal CLK is high level, and transmits a signal of the second node N2 to the third node N3.

A fourth inverter is connected between the third node N3 and the output data Q terminal. The fourth inverter includes two transistors M6p and M6n connected between the positive power supply voltage VDD source and the ground voltage source.

A fifth inverter includes two transistors M7p and M7n disposed between the positive power supply voltage VDD source and the ground voltage source. The fifth inverter inverts output data Q and transmits the inverted output data Q to a fourth switch.

A fourth switch is connected between the fifth inverter and the third node N3. The fourth switch is embodied as a transmission gate, and includes two transistors M8n and M8p. The inverted clock signal /CLK is input to a gate terminal of the transistor M8n, and the clock signal CLK is input to a gate terminal of the transistor M8p. Thus, the fourth switch is turned on and transmits an output of the fifth inverter to the third node N3, when the clock signal CLK is low level.

Unit elements of the circuit of FIG. 3 described above may be largely divided into inverters and switches. The inverters and the switches each have a CMOS structure.

Figure 4:
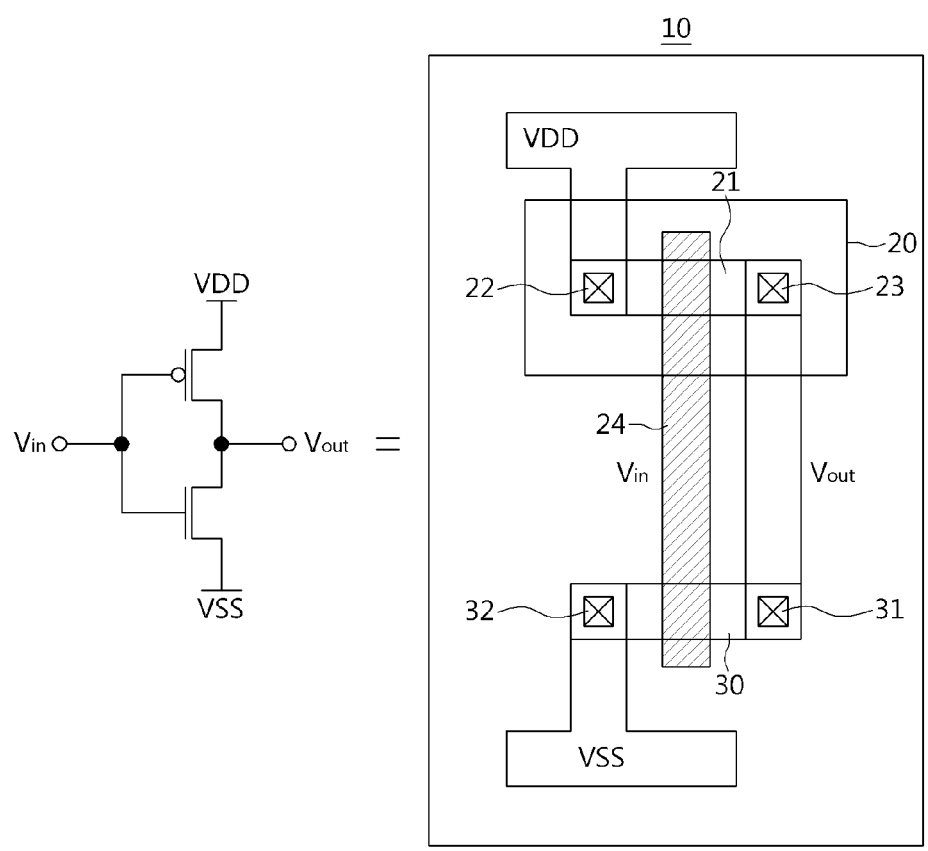
FIGS. 4 and 5 are layout diagrams of unit elements of the circuit of FIG. 3 according to exemplary embodiments of the present invention.
Figure 5:
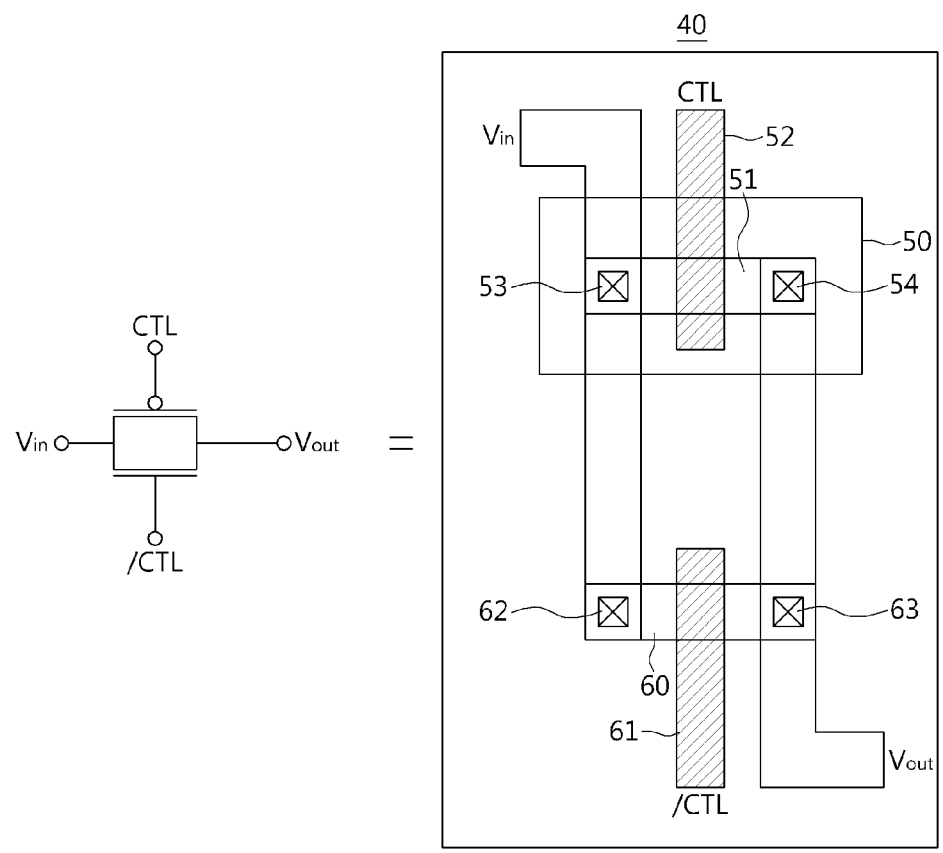

FIGS. 4 and 5 are layout diagrams of the unit elements of the circuit of FIG. 3 according to exemplary embodiments of the present invention.

First, an inverter will be described with reference to FIG. 4.

The inverter may have a CMOS structure, and includes a p-MOS transistor and an n-MOS transistor.

The p-MOS transistor is formed on an n-well 20 on a substrate 10. A p-type active region 21 is defined on the n-well 20. The p-type active region 21 is doped with a highly-concentrated p-type dopant. A gate 24 is formed to cross the p-type active region 21. A source contact 22 and a drain contact 23 are formed at both sides of the gate 24, respectively. Here, the term 'contact' means a via contact. That is, an interlayer insulating film is formed on the p-type active region 21, a via contact is formed to pass through the interlayer insulating film, and the via contact on the interlayer insulating film is electrically connected to a positive power supply voltage VDD source or an active region of the n-MOS transistor.

In particular, a source terminal of the p-MOS transistor is connected to the positive power supply voltage VDD source via the source contact 22. The drain contact 23 is disposed at a side facing the source contact 22. The drain contact 23 is connected to the active region of the n-MOS transistor via a metal wire.

The n-MOS transistor may be formed directly on the p-type substrate 10. In particular, an n-type active region 30 is disposed to approximately correspond to the p-type active region 21. According to an embodiment of the present invention, the p-type active region 21 may be formed to be larger than the n-type active region 30. This work is performed to match a current driving capability of the p-MOS transistor and a current driving capability of the n-MOS transistor at a similar level, since the mobility of a hole is lower than that of an electron. The gate 24 is formed to cross the n-type active region 30. Thus, the gate 24 is formed to cross both the p-type active region 21 and the n-type active region 30. Also, a drain contact 31 is formed on a drain terminal of the n-MOS transistor, and is connected to the drain terminal of the p-MOS transistor via a metal wire. Thus, the drain terminals of the p-MOS transistor and the n-MOS transistor are electrically connected to form an output terminal. A source terminal of the n-MOS transistor is connected to a ground voltage source or a negative power supply voltage VSS source via a source contact 32.

In the structure described above, the gate 24 generates an input voltage Vin, and the drain terminals of the n-MOS transistor and the p-MOS transistor generate an output voltage Vout.

A switch will now be described with reference to FIG. 5.

The switch has a transmission gate structure. That is, the switch has a structure in which an n-MOS transistor and a p-MOS transistor are connected in parallel.

First, an n-well area 50 is formed on a p-type substrate 40, and the p-MOS transistor is formed in the n-well region 50. To form the p-MOS transistor, a p-type active region 51 is included in the n-well area 50. A p-type gate 52 is formed to cross the p-type active region 51. A source region and a drain region are formed at respective sides of the p-type gate 52. According to characteristics of the transmission gate, the source region and the drain region are not actually differentiated from each other and may thus be used interchangeably.

The n-MOS transistor is formed on the p-type substrate 40. The n-MOS transistor is formed with an n-type gate 61 crossing an n-type active region 60. In other words, the n-type gate 61 is formed to cross the n-type active region 60, and source and drain regions are formed at both sides of the n-type gate 61, respectively. As described above, in the transmission gate, the source and drain regions are not actually differentiated from each other and may thus be used interchangeably. A source contact 62 of the n-MOS transistor is formed at a side of the n-type gate 61, and is connected to the source contact 53 of the p-MOS transistor via a metal wire. Similarly, a drain contact 63 of the n-MOS transistor is connected to the drain contact 54 of the p-MOS transistor via a metal wire.

Thus, when an input signal is supplied to a source terminal or a drain terminal, the n-MOS transistor and the p-MOS transistor perform an 'on/off' operation according to a signal CTL or /CTL supplied to the p-type gate 52 and the n-type gate 61.

The circuit diagrams of FIGS. 3 to 5 illustrate cases in which unit elements of a gate or a circuit are embodied as CMOS devices. In addition, various layouts may be applied, and only NMOS transistors or PMOS transistors may be used. Furthermore, unit elements of a gate or a circuit may be embodied as circuits on which a BiCMOS process may be performed, according to a designer's intention.

Figure 6:
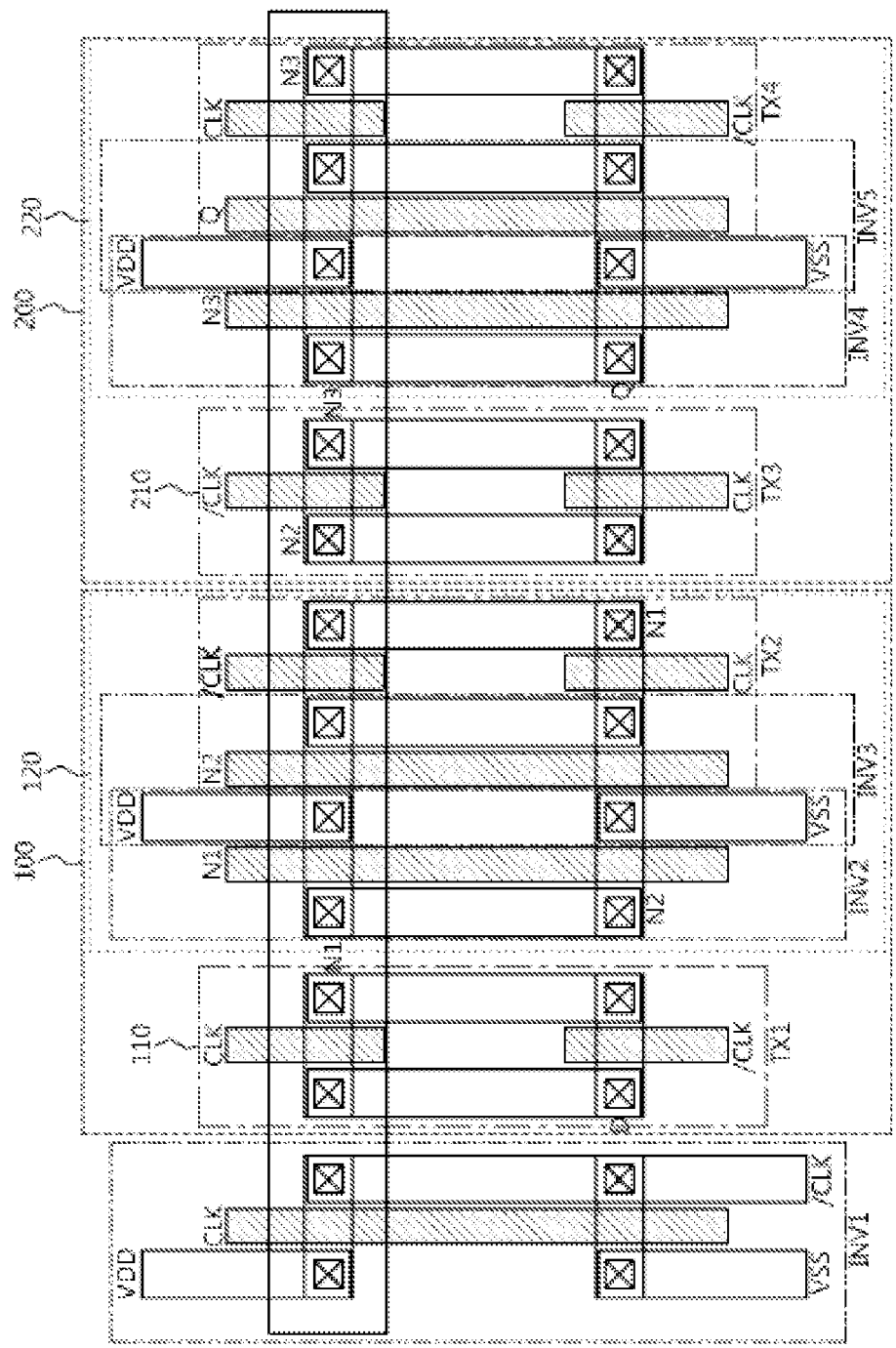
FIG. 6 is a layout diagram of the circuit of FIG. 3 according to an exemplary embodiment of the present invention.

FIG. 6 is a layout diagram of the circuit of FIG. 3 according to an exemplary embodiment of the present invention.

Referring to FIG. 6, four switches and five inverters are included in the circuit as illustrated in FIG. 2. FIG. 6 illustrates the arrangements of the switches and the inverters which are unit elements, and the types of signals supplied to and output from the switches and the inverters, but does not illustrate electrical wires installed between the switches and the inverters, for convenience of explanation.

In FIG. 6, a flip-flop is divided into a master latch 100 and a slave latch 200. In the case of a first inverter INV1 which is additionally illustrated, a clock signal CLK and an inverted clock signal /CLK may be supplied thereto via an additional supply line. Thus, according to an embodiment of the present invention, the first inverter INV1 may be omitted.

Also, a layout illustrated in FIG. 6 forms a unit layout. In the present disclosure, the term 'unit layout' means a structure in which p-MOS transistors are disposed on upper portions of CMOS transistors and n-MOS transistors are disposed at bottoms of the CMOS transistors. Otherwise, the term 'unit layout' may be understood as a unit in which an n-well that is generally used to form a p-MOS transistor is partitioned by one unit and active regions are disposed on the n-well. In particular, FIG. 6 illustrates that the unit layout includes one master latch 100 and one slave latch 200 which constitute a flip-flop to perform a complete flip-flop function. Also, the term 'unit layout' defined in the present disclosure may indicate a case in which flip-flops include two latches among master latches or slave latches.

First, referring to FIG. 6, the slave latch 200 is installed adjacent to the master latch 100.

The master latch 100 includes two circuit elements which will be hereinafter referred to as a first circuit element 110 and a second circuit element 120. The first circuit element 110 includes a first switch TX1, and the second circuit element 120 includes a second inverter INV2, a third inverter INV3, and a second switch TX2.

The slave latch 200 includes two circuit elements which will be hereinafter referred to as a third circuit element 210 and a fourth circuit element 220. The third circuit element 210 includes a third switch TX3, and the fourth circuit element 220 includes a fourth inverter INV4, a fifth inverter INV5, and a fourth switch TX4.

The names and definitions of the circuit elements are simply assigned to differentiate them from one another on the layout, and may thus be differently named and defined according to another embodiment of the present invention.

In FIG. 6, the first circuit element 110 to the fourth circuit element 220 are sequentially disposed.

First, the first inverter INV1 is formed. The structure of the first inverter INV1 is the same as described above with reference to FIG. 4, except that a clock signal CLK is supplied to an input gate of the first inverter INV1 and an inverted clock signal /CLK is formed by inverting the clock signal CLK via a common drain contact.

The first switch TX1 is disposed adjacent to the first inverter INV1. The first switch TX1 has the same structure as the transmission gate illustrated in FIG. 4. Input data D is supplied to one end of the first switch TX1 via a wire, and another end of the first switch TX1 opposite to the one end is connected to a first node N1 via a wire. The clock signal CLK is supplied to a gate terminal of a p-MOS transistor, and the inverted clock signal /CLK is supplied to a gate terminal of an n-MOS transistor. The clock signal CLK and the inverted clock signal /CLK are obtained from a signal generated by the first inverter INV1, and are supplied to the entire circuit via an additional wire line.

The second inverter INV2, the third inverter INV3, and the second switch TX2 are sequentially formed at a side adjacent to the first switch TX1 and facing the first inverter INV1. In particular, the second inverter INV2, the third inverter INV3, and the second switch TX2 may be preferably optimized for layout size efficiency. Layout optimization may be accomplished by sharing terminals between adjacent transistors.

First, the second inverter INV2 is formed, and a signal of the first node N1 is supplied to a gate terminal of the second inverter INV2. An output of the second inverter INV2 is delivered to a second node N2.

Also, the third inverter INV3 is formed adjacent to the second inverter INV2. The third inverter INV3 shares a source terminal with the second inverter INV2. That is, a p-MOS source terminal of the second inverter INV2 and the third inverter INV3 is connected to a positive power supply voltage VDD source, and an n-MOS source terminal of the second inverter INV2 and the third inverter INV3 is connected to either a ground voltage source or a negative power supply voltage VSS source. Also, a signal of the second node N2 is supplied to a gate terminal of the third inverter INV3. An output of the second inverter INV2 is supplied to drain terminals of p-MOS transistor and n-MOS transistor that are commonly connected to the second inverter INV2, and then is supplied to the second switch TX2 adjacent to the third inverter INV3.

The second switch TX2 is disposed adjacent to the third inverter INV3 and shares the drain terminals of the p-MOS transistor and the n-MOS transistor with the third inverter INV3. A switching operation is controlled by the inverted clock signal /CLK supplied to the gate terminal of the p-MOS transistor and the clock signal CLK supplied to the gate terminal of the n-MOS transistor. An output signal of the second switch TX2 is fed back to the first node N1 via a wire.

A third switch TX3 is disposed at a side of the second switch TX2. A signal of the second node N2 is supplied to one end of the third switch TX3 and output to a third node N3. The third switch TX3 is switched on or off by the inverted clock signal /CLK supplied to the gate terminal of the p-MOS transistor and the clock signal CLK supplied to the gate terminal of the n-MOS transistor.

The fourth inverter INV4, the fifth inverter INV5, and fourth switch TX4 are disposed at a side of the third switch TX3. The fourth inverter INV4, the fifth inverter INV5, and the fourth switch TX4 may have the same structures and arrangements as the second inverter INV2, the third inverter INV3, and the second switch TX2.

Figure 7:
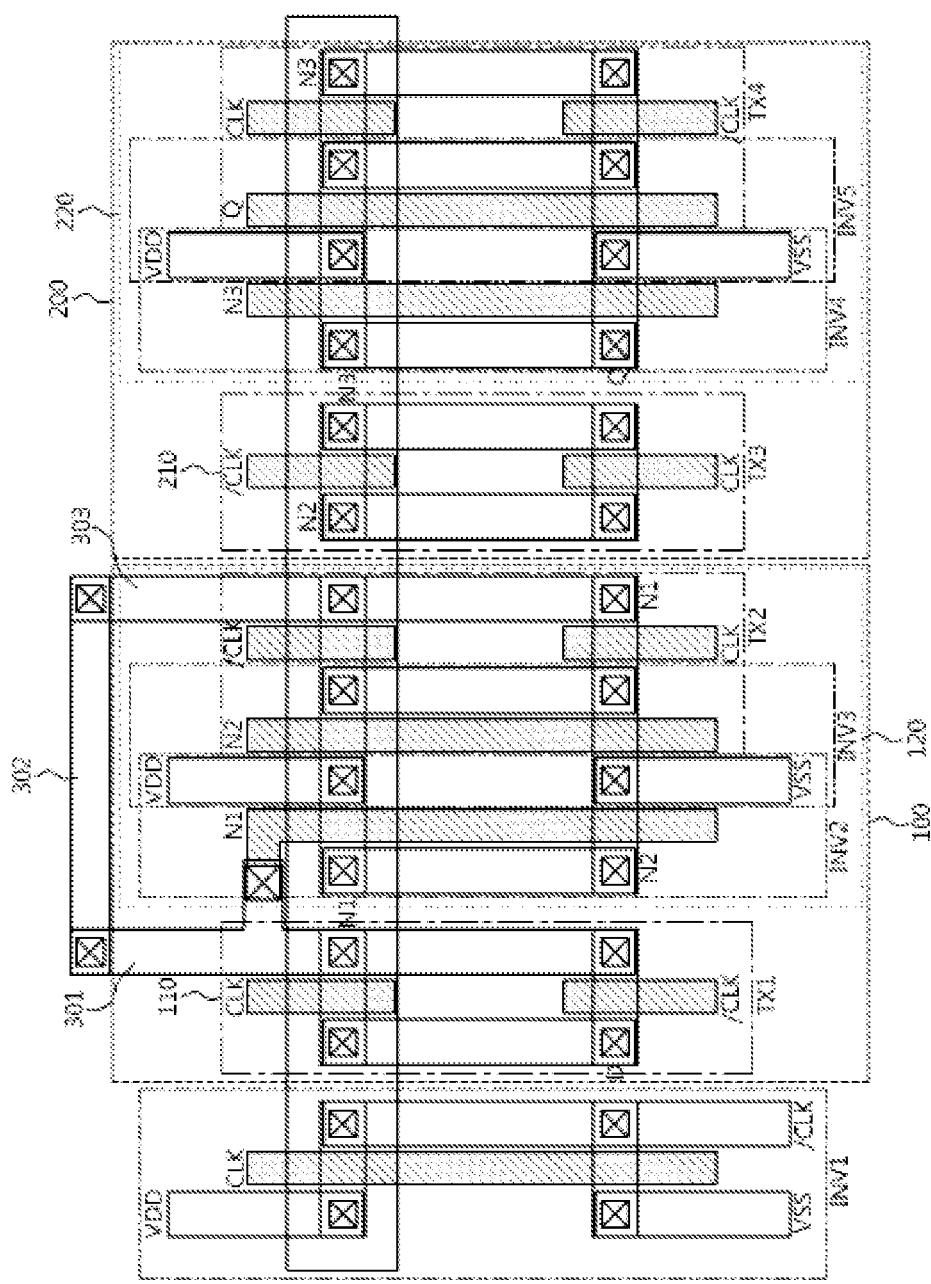
FIG. 7 is a layout diagram of some wires in the layout of FIG. 6 according to an exemplary embodiment of the present invention.

FIG. 7 is a layout diagram of some wires in the layout of FIG. 6 according to an exemplary embodiment of the present invention.

Referring to FIG. 7, specific devices, e.g., the first circuit element 110 and the second circuit element 120, are connected to the first node N1. That is, the first node N1 is connected to the first switch TX1, the second inverter INV2, and the second switch TX2. For the electrical connections, a wire structure should be formed. The wire structure is formed between the first circuit element 110 and the second circuit element 120.

Referring to FIG. 7, a first metal wire 301 extends from an output terminal of the first switch TX1 via a contact. The first metal wire 301 is electrically connected to the gate terminal of the second inverter INV2. Since a gate of a transistor is generally formed of polycrystalline silicon, the first metal wire 301 and polycrystalline silicon are formed at different layers. Thus, the contact is formed, and the first metal wire 301 is thus connected to the gate terminal of the second inverter INV2 via the contact.

Also, referring to FIG. 7, the first metal wire 301 extending upward is bent to the right to be connected to an output terminal of the second switch TX2. To this end, an additional contact may be formed. This is because an additional line is needed to supply a positive power supply voltage VDD and a signal transmission line is preferably formed on a different layer on which the positive power supply voltage VDD source is not formed. Thus, the first metal wire 301 is electrically connected to a second metal wire 302, and the second metal wire 302 extends to the right and is electrically connected to the output terminal of the second switch TX2 via a third metal wire 303. The third metal wire 303 is preferably an extended metal wire connected to a first node N1 of the second switch TX2.

Figure 8:
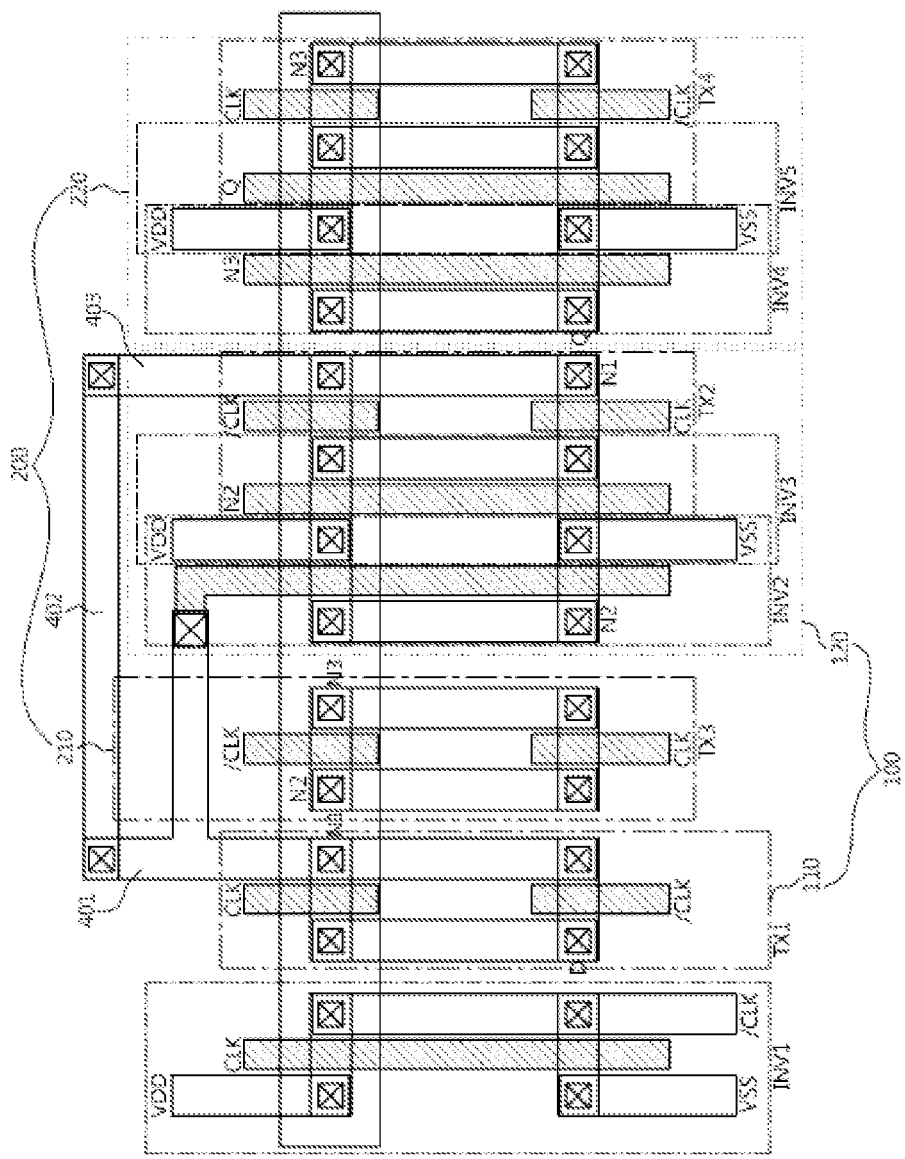
FIG. 8 is a layout diagram illustrating a modified example of a layout of the circuit of FIG. 3.

FIG. 8 is a layout diagram illustrating a modified example of a layout of the circuit of FIG. 3.

Referring to FIG. 8, a region in which a master latch 100 is formed and a region in which a slave latch 200 is formed cross each other. That is, the second circuit element 120 of the master latch 100 and the third circuit element 210 of the slave latch 200 illustrated in FIG. 7 are arranged to cross each other. This means that the master latch 100 and the slave latch 200 are formed in a shared region.

To form a circuit that is equivalent to the circuit of FIG. 7, a wire should be formed between the first circuit element 110 and the second circuit element 120. Thus, the wire between the first circuit element 110 and the second circuit element 120 extends through the third circuit element 210 disposed between the first circuit element 110 and the second circuit element 120.

That is, an output terminal of the first switch TX1 forms a first node N1 via a first metal wire 401 formed upward. The shape of the first metal wire 401 is roughly similar to or the same as that of the first metal wire 301 of FIG. 7. However, since the third circuit element 210 is disposed between the first circuit element 110 and the second circuit element 120, the second metal wire 402 is longer than the second metal wire 302 illustrated in FIG. 7. Also, the shape of the third metal wire 403 that is electrically connected to the second switch TX2 is substantially the same as that of the third metal wire 303 illustrated in FIG. 7. Thus, a coupling capacitance when each transistor is viewed at the first node N1 in the layout of FIG. 8 is higher than in the layout of FIG. 7.

A coupling capacitance is generated by an electrical wire between semiconductor devices. In a MOS system, an operation of a device largely depends on a capacitance. The capacitance is greatly influenced by an arrangement and a wire structure between transistors, except a process of physically forming a capacitor like a dynamic random access memory (DRAM). For example, a capacitance at an output terminal of a CMOS gate is explained as the sum of three capacitances, e.g., a gate capacitance, a diffusion capacitance, and a routing capacitance.

First, the gate capacitance is generated by an input terminal of another CMOS gate connected to the output terminal of the CMOS gate.

Second, the diffusion capacitance is generated by a drain region of a MOS transistor that forms an output terminal. In general, the drain region is doped with a highly-concentrated dopant, and a well region or a substrate that is doped with a complementarily light dopant is formed at an edge of the drain region. Also, a depletion region is formed at the edge of the drain region, and a capacitance occurs between the drain region doped with the highly-concentrated dopant and the well region.

Third, the routing capacitance means a capacitance formed by a wire between the output terminal of the CMOS gate and an input terminal of another CMOS gate.

These capacitances may be changed in various ways, and are influenced by an arrangement of and a wire structure between the circuits. Also, these capacitances are influenced by the sizes and shapes of unit MOS transistors. In particular, the diffusion capacitance is greatly influenced by the size and shape of the MOS transistor, and the gate capacitance is greatly influenced by the arrangement of circuits. In particular, the specification of the gate capacitance is a factor that determines fan-in/fan-out of a CMOS gate.

The routing capacitance is influenced by a wire that connects unit transistors. For example, the routing capacitance increases when a wire line is long, and a signal transmission speed is influenced when a wire is formed adjacent to an active region of a transistor, thereby causing the routing capacitance to increase.

As described above, various capacitances form a parasitic load, and the parasitic load is a factor that determines an operating speed of a semiconductor device. Thus, even if circuits are the same type, the operating speeds of these circuits are differently set according to a layout.

As described above with reference to FIGS. 7 and 8, a change in various coupling capacitances may be induced by changing the arrangements of circuit elements while the same equivalent circuits are formed. This may be accomplished by changing an arrangement between individual circuit elements even when the individual circuit elements have the same layout. In other words, a change in a coupling capacitance may be induced by forming a master latch and a slave latch in a unit layout such that regions in which these latches are respectively formed cross each other.

Figure 9:
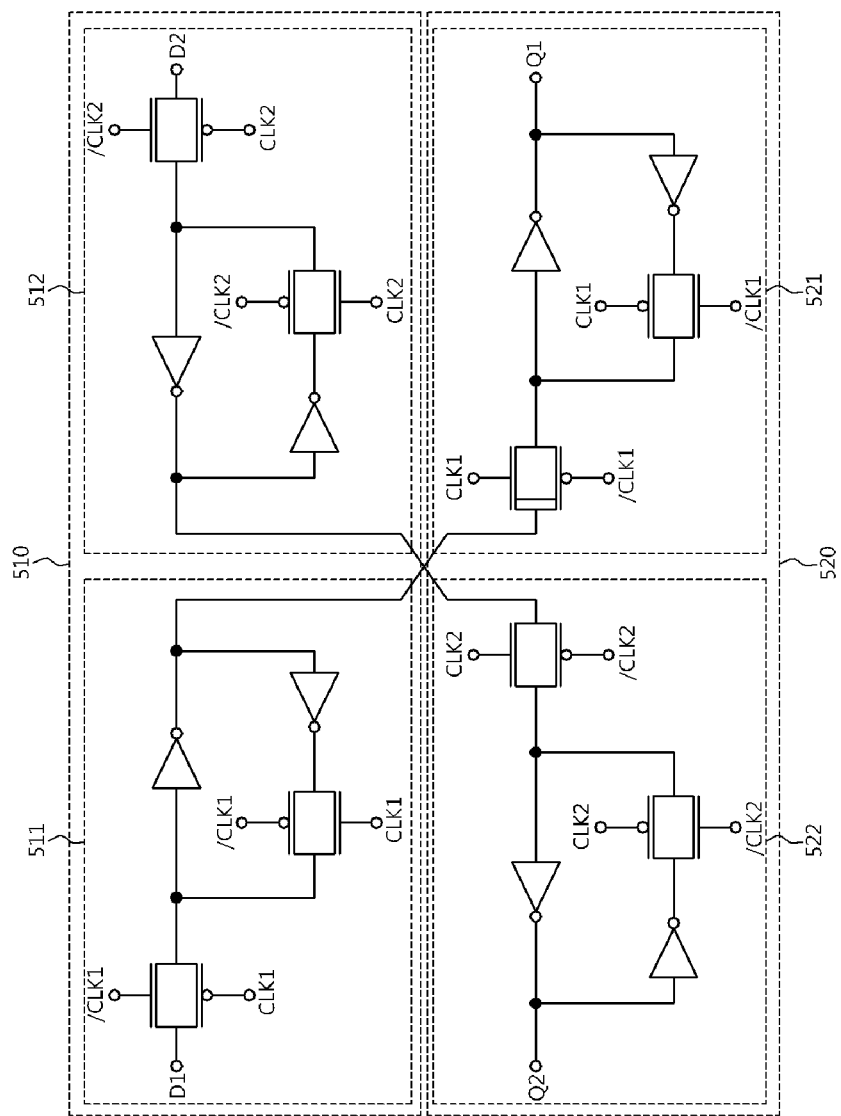
FIGS. 9 and 10 are circuit diagrams of libraries of flip-flops according to exemplary embodiments of the present invention.
Figure 10:
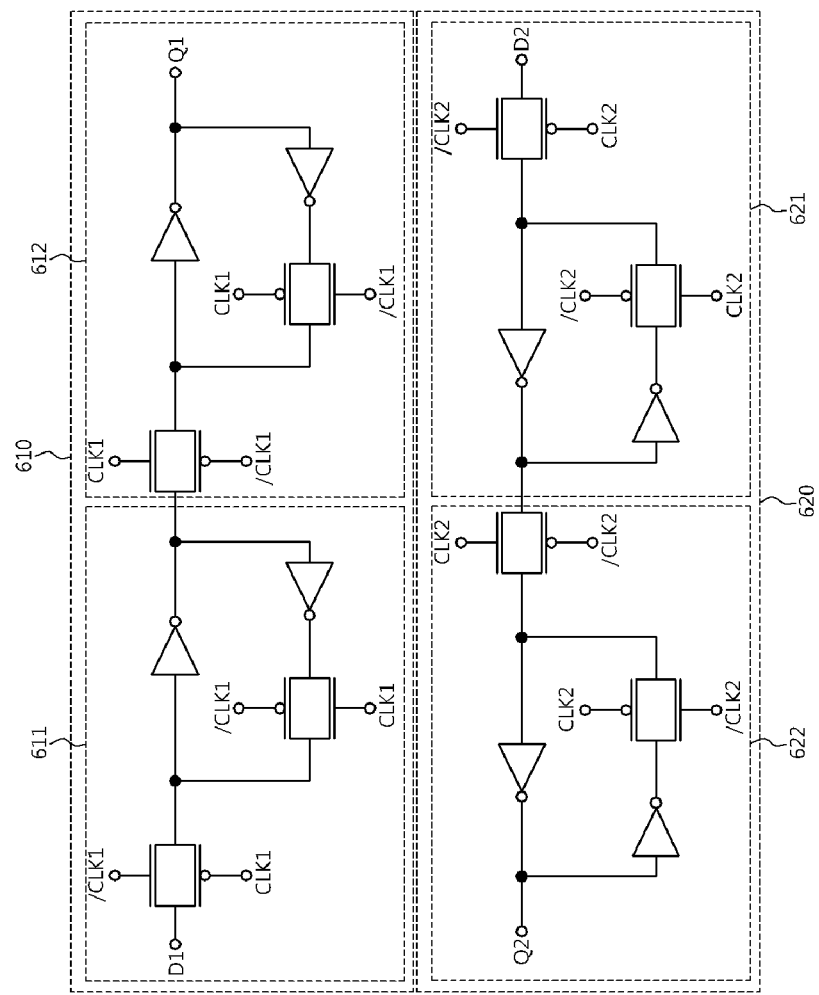

FIGS. 9 and 10 are circuit diagrams of libraries of flip-flops according to exemplary embodiments of the present invention.

Referring to FIG. 9, two unit layouts 510 and 520 are formed adjacent to each other. The second unit layout 520 is disposed adjacent to the first unit layout 510.

Also, two latches are disposed in each of the unit layouts 510 and 520 as described above.

In the first unit layout 510, a first master latch 511 of a first flip-flop and a second master latch 512 of a second flip-flop are formed. In the second unit layout 520, a first slave latch 521 of the first flip-flop and a second slave latch 522 of the second flip-flop are formed. That is, one flip-flop includes a combination of a master latch and a slave latch. In general, a master latch and a slave latch that constitute one flip-flop are formed in a single unit layout, whereas referring to FIG. 9, two latches that constitute one flip-flop are formed to extend over two unit layouts.

Thus, a coupling capacitance seen at a side of the first master latch 511 is determined by circuit elements of the second slave latch 522. Also, a wire between the first master latch 511 and the first slave latch 521 is formed to extend over the two unit layouts 510 and 520. Thus, a coupling capacitance increases and changes due to the wire.

In FIG. 9, two unit layouts such as the unit layout illustrated in FIG. 7 or 8 are formed, and a master latch and a slave latch that constitute one flip-flop are formed in each of the two unit layouts. A coupling capacitance in a specific flip-flop may be changed using an above-described layout.

Referring to FIG. 10, two flip-flop circuits are spread and arranged in different directions.

For example, a signal is transmitted from a first flip-flop to the right, and is transmitted from a second flip-flop to the left. Also, one flip-flop is included in one unit layout. That is, the flip-flop having the layout illustrated in any of FIGS. 6 to 8 may be included in one unit layout, and such unit layouts may be disposed adjacent to each other.

Thus, a first master latch 611 and a first slave latch 612 of a first flip-flop are formed in a first unit layout 610, and a second master latch 621 and a second slave latch 622 of a second flip-flop are formed in a second unit layout 620. Here, directions in which signals are transmitted from the first and second flip-flops are different, and different coupling capacitances thus occur, compared to two flip-flops having the same layout and the same signal transmission direction.

Figure 11:
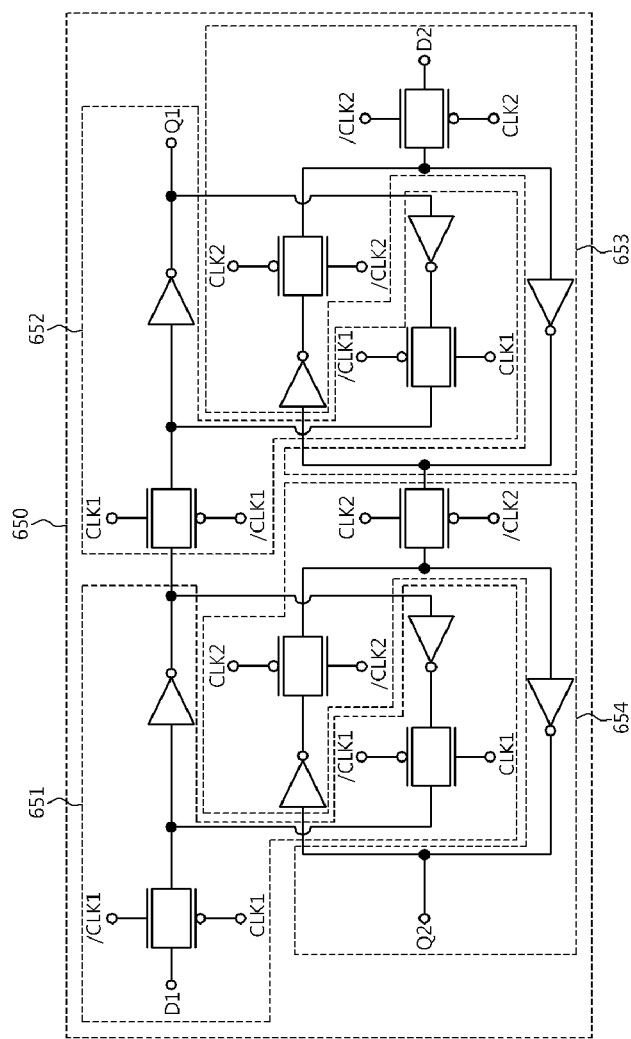
FIG. 11 is a circuit diagram illustrating a case in which at least two flip-flops are included in one unit layout according to an exemplary embodiment of the present invention.

FIG. 11 is a circuit diagram illustrating a case in which at least two flip-flops are included in one unit layout according to an exemplary embodiment of the present invention.

Referring to FIG. 11, a first flip-flop and a second flip-flop are different in terms of a signal transmission direction. Also, some circuit elements that constitute one flip-flop share a region with another flip-flop.

For example, a region of the first flip-flop in which a first master latch 651 is formed shares a region of the second flip-flop in which a second slave latch 654 is formed. Also, a region of the first flip-flop in which a first slave latch 652 is formed shares a region of the second flip-flop in which a second master latch 653 is formed.

In other words, some of the elements of the first flip-flop and some of the elements of the second flip-flop are formed in the same unit layout 650.

The circuit structure illustrated in FIG. 11 is modeled at a gate level in regions of one unit layout 650 in which the elements are formed. That is, inverters and switches formed in a feedback path of the second slave latch 654 of the second flip-flop are disposed between inverters and switches formed in a feedback path of the first master latch 651 of the first flip-flop.

Thus, referring to FIG. 11, when a clock signal CLK1 supplied to the first flip-flop is set to be high level and a clock signal CLK2 supplied to the second flip-flop is set to be low level, a symmetry occurs in a signal behavior between two circuit elements formed in a shared region. That is, latches disposed to be adjacent to each other in two flip-flops sharing a region repeatedly perform holding and driving. For example, while the first master latch 651, which is formed in a layout in which the second slave latch 654 is formed and is disposed to be adjacent to the second slave latch 654, performs holding, the second slave latch 654 performs driving for signal processing. An external capacitance or load seen at a latch performing driving may be isotropically balanced. This means that the occurrence of noise when driving is performed is minimized in a specific circuit element.

In addition, circuit elements that are relatively robust to a noise may be disposed around a switch in which the noise highly probably occurs. For example, the noise is highly probably generated in switches to which a clock signal is input. When the noise is generated, the noise causes a circuit to malfunction. Thus, latches included in a switch that is sensitive to the noise or in which the noise is very likely to be generated are preferably disposed to be relatively distant from a node that is sensitive to the noise.

Referring to FIG. 11, two flip-flops arranged in different directions are disposed in one unit layout. However, according to another embodiment of the present invention, only some of latches that constitute a flip-flop may be included in one unit layout.

However, at least two flip-flops in which signals are transmitted in the same direction, rather than different directions, may also be arranged in one unit layout.

Figure 12:
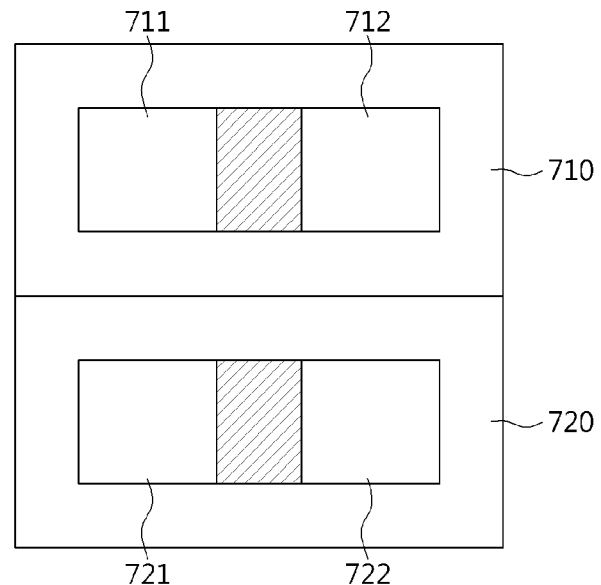
FIG. 12 is a block diagram illustrating a case in which at least two flip-flops are included in two unit layouts according to an exemplary embodiment of the present invention.

FIG. 12 is a block diagram illustrating a case in which at least two flip-flops are included in two unit layouts according to an exemplary embodiment of the present invention.

Referring to FIG. 12, two flip-flops are included in each of the two unit layouts 710 and 720 illustrated in FIGS. 6 to 8. In particular, the two flip-flops are not separated from each other but appear to share a region.

In the first unit layout 710, a first master latch 711 of the first flip-flop and a second master latch 712 of the second flip-flop are formed. Also, the two master latches 711 and 712 may be formed to cross each other. The forming of the two master latches 711 and 712 that cross each other may be performed by changing locations of circuit elements of the two master latches 711 and 712, similar to as illustrated in FIG. 8.

The second unit layout 720 is disposed below the first unit layout 710. In the second unit layout 720, a first slave latch 721 of the first flip-flop and the second slave latch 722 of the second flip-flop are formed. In the second unit layout 720, the first slave latch 721 and the second slave latch 722 are arranged to cross each other. A shape in which the first slave latch 721 and the second slave latch 722 cross each other is similar to that illustrated in FIG. 8. Accordingly, some circuit elements of the first slave latch 721 and the second slave latch 722 are formed in the same unit layout.

Figure 13:
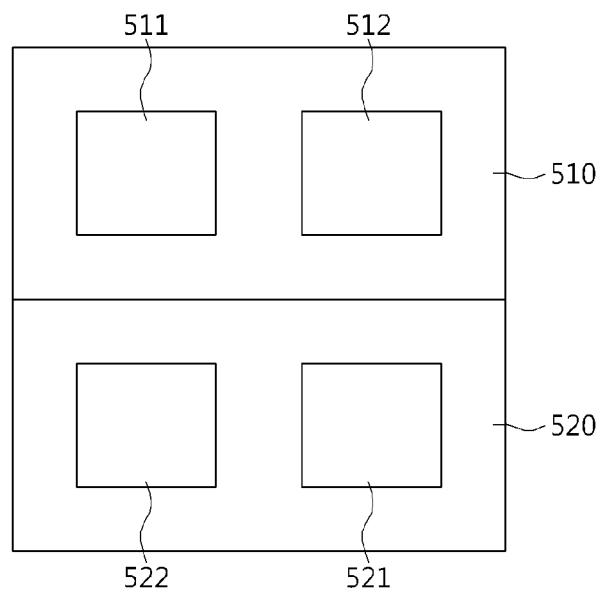
FIGS. 13 and 14 are block diagrams illustrating layouts of the circuits of FIGS. 9 and 10 according to exemplary embodiments of the present invention.
Figure 14:
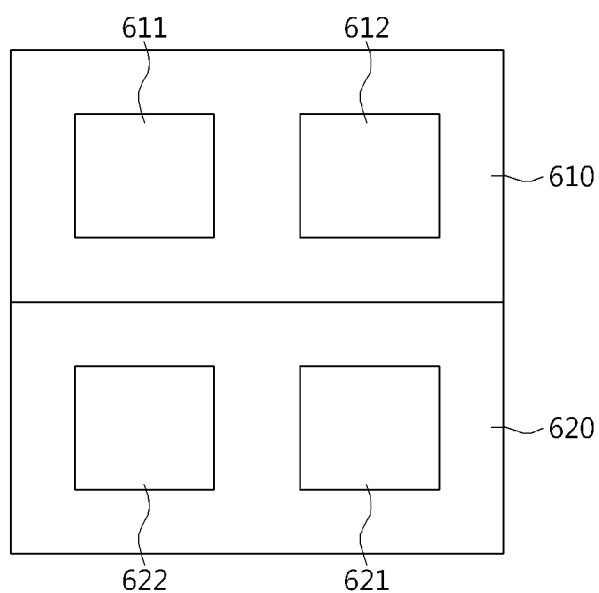

FIGS. 13 and 14 are block diagrams illustrating layouts of the circuits of FIGS. 9 and 10 according to exemplary embodiments of the present invention.

Referring to FIG. 13, the circuit diagram of FIG. 9 is embodied as a layout, in which flip-flops are not divided by a unit layout but are arranged to share a region in two unit layouts.

Specifically, a first master latch 511 of a first flip-flop and a second master latch 512 of a second flip-flop are formed in a first unit layout 510, and a first slave latch 521 of the first flip-flop and a second slave latch 522 of the second flip-flop are formed in a second unit layout 520.

Referring to FIG. 14, the circuit diagram of FIG. 10 is embodied as a layout, in which flip-flops are formed in unit layouts, respectively. However, the flip-flop formed in one of the unit layouts and the flip-flop formed in the other unit layout adjacent to the unit layout are set to be different in terms of a signal transmission direction. Thus, directions in which circuits are arranged are also set to be different. That is, even if operations of the circuits are the same, the two unit layouts are symmetric with each other since the signal transmission directions of the circuits are different.

Thus, a first flip-flop is formed in a first unit layout 610. That is, a first master latch 611 and a first slave latch 612 in which signals are transmitted to the right are formed in the first unit layout 610. Also, the first master latch 611 and the first slave latch 612 are separated from each other.

A second unit layout 620 is formed adjacent to the first unit layout 610. In the second unit layout 620, a second flip-flop is formed. Thus, in the second unit layout 620, a second master latch 621 and a second slave latch 622 are sequentially formed. However, a direction in which a signal is transmitted from the second flip-flop is set to the left. Accordingly, the first slave latch 612 is formed adjacent to a location corresponding to the second master latch 621, and the first master latch 611 is formed adjacent to a location corresponding to the second slave latch 622.

In flip-flop layouts as described above, a plurality of flip-flops of the same equivalent circuits are formed in the layouts. In this case, the plurality of flip-flops are arranged in various manners. This means that the same equivalent circuits that perform the same functions are formed in different shapes in the layouts. Thus, a coupling capacitance seen at a specific location on one of the layouts is differently set at even the same device or node in the same equivalent circuits, according to a selected unit layout.

This increases the degree of freedom of selecting flip-flops when a semiconductor designer designs one device. For example, when a coupling capacitance is low in a signal path in which a high output current is set, a malfunction occurs to cause an inverted signal of a desired output signal to be generated rather than the desired output signal. However, when a coupling capacitance seen at a terminal of a specific flip-flop is high, a normal output signal may be generated since charging/discharging is sufficiently performed even if an operating speed is low.

Flip-flops disclosed in the present disclosure include the same equivalent circuits. That is, the flip-flops are the same in view of circuit diagrams and functions thereof but are different in view of shapes in layouts. Thus, a coupling capacitance of an adjacent flip-flop may be used if needed. Also, a flip-flop that matches impedances and frequency characteristics of peripheral circuits connected to an input terminal and an output terminal of a flip-flop circuit may be selected.

This means that layouts may be selected according to a purpose of a circuit to be finally formed by a semiconductor designer, flip-flops classified into groups may be formed in the layouts, and a wiring process may be performed to be suitable for a function of a circuit to be formed.

Also, according to the present invention, two unit layouts are formed, but the number of unit layouts may be expanded to three or more. Thus, a plurality of flip-flop layouts that have various arrangements and have different coupling capacitances at the same node may be formed. Accordingly, a semiconductor designer can expand the degree of freedom of selecting a coupling capacitance, and can minimize malfunction of a circuit to be formed.

The invention claimed is:

1. A layout library in which a plurality of flip-flops have the same equivalent circuits and are comprised of an unit layout, and a plurality of unit layouts are combined, wherein a first unit layout has a different arrangement from a second unit layout adjacent to the first unit layout.

2. The layout library of claim 1, wherein the first unit layout comprises:
a first master latch configured to sample and store first input data; and
a first slave latch connected to the first master latch and configured to generate first output data,
wherein a region in which the first master latch is formed and a region in which the first slave latch is formed cross each other.

3. The layout library of claim 2, wherein the second unit layout comprises:
a second master latch configured to sample and store second input data; and
a second slave latch connected to the second master latch and configured to generate second output data,
wherein a region in which the second master latch is formed and a region in which the second slave latch is formed cross each other, and
a direction in which a signal is transmitted from the first unit layout and a direction in which a signal is transmitted from the second unit layout are opposite to each other.

4. The layout library of claim 1, wherein the first unit layout comprises some circuit elements of a first flip-flop and some circuit elements of a second flip-flop.

5. The layout library of claim 4, wherein the first unit layout comprises:
a first master latch of the first flip-flop; and
a second master latch of the second flip-flop.

6. The layout library of claim 5, wherein the second unit layout comprises:
a first slave latch of the first flip-flop; and
a second slave latch of the second flip-flop.

7. The layout library of claim 5, wherein a region in which the first master latch is formed and a region in which the second master latch is formed cross each other.

8. A layout library in which flip-flops are embodied as semiconductor circuits, the layout library comprising:
a first unit layout in which two latches are arranged; and
a second unit layout which is included in a region adjacent to the first unit layout, wherein two latches are arranged in the second unit layout,
and wherein the second unit layout has a different arrangement from the first unit layout.

9. The layout library of claim 8, wherein at least two flip-flops included in the layout library have the same circuit structure, and
coupling capacitances of the at least two flip-flops when seen at the same node are different.

10. The layout library of claim 8, wherein two flip-flops are formed in the first unit layout and the second unit layout, and
some circuit elements of the two flip-flops are included in the first unit layout.

11. A layout library in which a plurality of flip-flops are comprised of an unit layout, and a plurality of unit layouts are combined, the layout library comprising:
a first flip-flop including at least two latches; and
a second flip-flop including at least one latch that shares the same unit layout with at least one of the at least two latches of the first flip-flop.

12. The layout library of claim 11, wherein directions in which signals are transmitted from the two flip-flops, respectively, are different.

13. The layout library of claim 11, wherein directions in which signals are transmitted from the two flip-flops, respectively, are the same.

* * * * *